United States Patent [19]
Söderbärg et al.

[11] Patent Number: 6,013,942
[45] Date of Patent: Jan. 11, 2000

[54] BIPOLAR TRANSISTOR STRUCTURE

[75] Inventors: Anders Söderbärg, Uppsala; Nils Ola Ögren, Vällingby; Håkan Sjödin, Knivsta, all of Sweden

[73] Assignee: Telefonaktiebolaget LM Ericsson, Stockholm, Sweden

[21] Appl. No.: 09/053,946

[22] Filed: Apr. 3, 1998

[30] Foreign Application Priority Data

Apr. 4, 1997 [SE] Sweden .................................. 9701241

[51] Int. Cl.⁷ ...................... H01L 27/082; H01L 27/102; H01L 29/70; H01L 31/11
[52] U.S. Cl. .......................... 257/580; 257/577; 257/581; 257/582
[58] Field of Search ................................. 257/577, 579, 257/580, 581, 582

[56] References Cited

U.S. PATENT DOCUMENTS 5,773,873  6/1998  Kuriyama ................................. 257/563
5,821,602  10/1998  Hebert et al. ............................ 257/581
5,939,768  8/1999  Palara ....................................... 257/577

*Primary Examiner*—Ngân V. Ngô
*Attorney, Agent, or Firm*—Burns, Doane, Swecker & Mathis, L.L.P.

[57] ABSTRACT

In order to avoid thermal runaway bipolar transistors, emitters are provided with ballast resistors. Elongate ballast resistors may be used, part of the lengths being connected for obtaining suitable resistance and design variability. The emitters are split up into a plurality of emitter portions, each with a separate emitter ballast resistor. The collector and base are correspondingly split up. The transistor is split up into unit cells, each comprising an emitter, a ballast resistor, a base, and a collector, which are respectively connected via respective common leads. This structure may advantageously be realized in a SOI technique, the galvanic isolation enabling unproblematic mixing of digital and analog and power devices in the same chip.

15 Claims, 4 Drawing Sheets ial cooling may thus be compensated by the inventive ballast resistors. An isolation from other devices on a

BIPOLAR TRANSISTOR STRUCTURE

TECHNICAL FIELD

The invention regards integrated circuits and in particular transistors for amplifier structures within integrated circuit chips, which may be provided with low-level digital and analog circuits.

BACKGROUND

It is previously known in bipolar transistors to provide an emitter system consisting of mutually parallel emitter fingers with emitter resistors, one for each emitter finger and generally provided outside the emitter region and generally in the prolongations of the respective emitter fingers. To a certain degree, this solves the problem of current increase due to local overheating of one of the emitter-base regions, which leads to thermal runaway. However, experience shows that even with such ballast resistors, local heating occurs, such that all the fingers heat more at the respective portions where they are connected to the ballast resistors than at other portions, and infrared photographs indicate rather that a collective heating between the collector fingers occurs at high loads, making the total efficiency less than optimal.

Solutions according to the concept as mentioned above are known, where emitter ballast resistors are situated within the semiconductor devices, instead of in the prolongations of elongate emitter fingers or linear arrays of emitter patches. Such solutions are known from U.S. Pat. Nos. 5,374,844 and 5,444,292. Between those solutions is common that resistive layers are arranged between emitter zones in the silicon and metal overlay emitter leads, such that current therebetween is submitted to a resistive path depthwise and sidewise, perpendicular to the emitter direction or emitter patch linear direction.

SUMMARY OF THE INVENTION

According to an aspect, it is an object to make a versatile cell-type integrated-circuit transistor, which may be used either as a sole unit transistor or in the form of several such unit cells combined in parallel.

It is another object of the present invention to further improve the measures against thermal runaway by using distributed ballast resistors. This and other objects according to the invention are obtained by means of a semiconductor device, of transistor type, where the emitter is split up into emitter portions, which are provided each with its own ballast resistor arranged adjacent its respective emitter portion.

An important aspect of the present invention is the division of the emitter part of the semiconductor device into a plurality of unit cells, each having its own emitter and ballast resistor, the ballast resistor being integrated in the same unit cell, which is important for saving so-called real estate on the silicon surface. In further embodiments, also the collector and base portions may be compartmentalized.

It is a particular object of the present invention also to obtain a versatile cell construction, which can be multiplied at will on a semiconductor surface, which makes for simplified design.

Although the compartmentalization into unit cells may be obtained in other ways, the invention is exemplified by a Silicon On Insulator (SOI) embodiment. The disadvantage of impaired cooling may thus be compensated by the inventive ballast resistors. An isolation from other devices on a chip is then obtained in an advantageous way by vertical oxide walls. The semiconductor device comprised of one cell or a plurality of unit cells is galvanically separated from other portions in a VLSI construction which may also comprise various digital circuits and analog circuits working at considerably lower power. An example of such an application is for an interface in a telephone system, a SLIC (Subscriber Line Interface Circuit), where several power transistors are needed for creating the ringing-current. More generally, the galvanic separation makes the device maximally versatile—a push-pull device can be arranged just as easily as a Darlington pair.

In an advantageous configuration, the ballast resistors, which may be thin-film resistors or suitably doped polysilicon, the resistors are simultaneously used for field control, if laid over e.g. a pn transition, the resistor having of necessity a voltage near that of the base and emitter voltages.

When the thin-film or polysilicon elongate ballast resistor in each cell is parallel to the emitter in the cell, it is possible to arrange for contacting it to the emitter and to the common emitter lead in respective contact points, making the resistance dependent on the length of the resistor used. A standard cell used for large scale integration may thus be made with modified ballast resistance depending on the intended use, just by changing a contact point.

Using unit cells enables ease in the change of models describing the electric properties of the transistor. The number of cells may be chosen at will, sometimes as single cells, in other cases comprising hundreds of cells, in order to cater for different applications.

BRIEF DESCRIPTION OF DRAWINGS

The invention shall now be described departing from an exemplary embodiment, illuminating but not delimiting the invention, and in connection with the drawings.

DETAILED DESCRIPTION

Figure 1:
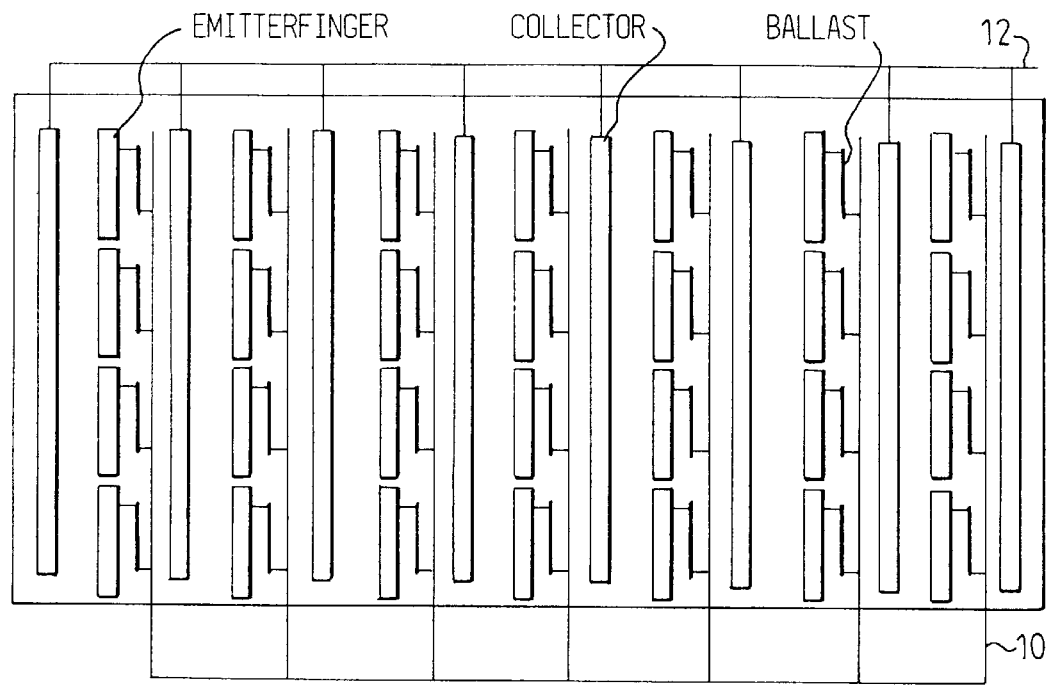
FIG. 1 shows schematically a set of unit cells forming a semiconductor device according to an aspect of the invention.

In FIG. 1 is shown a top view of a portion of a semiconductor device, with a set of finger-like collectors connected to a common collector lead 12. The emitters are split into emitter finger portions, each connected to a common emitter lead 10. The base leads are not shown in this figure. The emitter finger portions are arranged generally elongately in a common direction, and the ballast resistors are substantially parallel to the common direction. It can further be seen in this figure that the emitter ballast resistors are connected at one end to the respective emitters and with the opposite end to the common emitter lead 10. Although not shown in this Figure, it is possible to have a base region underneath, split into portions, one under each emitter, and such that the border of which is toward the respective collector is overlaid with sandwiched isolation by the respective ballast resistor. In this embodiment, the collectors are elongate fingers cooperating each with a linear set of emitters. It should be understood that the number of emitters shown is so low only for illustration purposes and that the number may be at least an order of magnitude higher.

Figure 2:
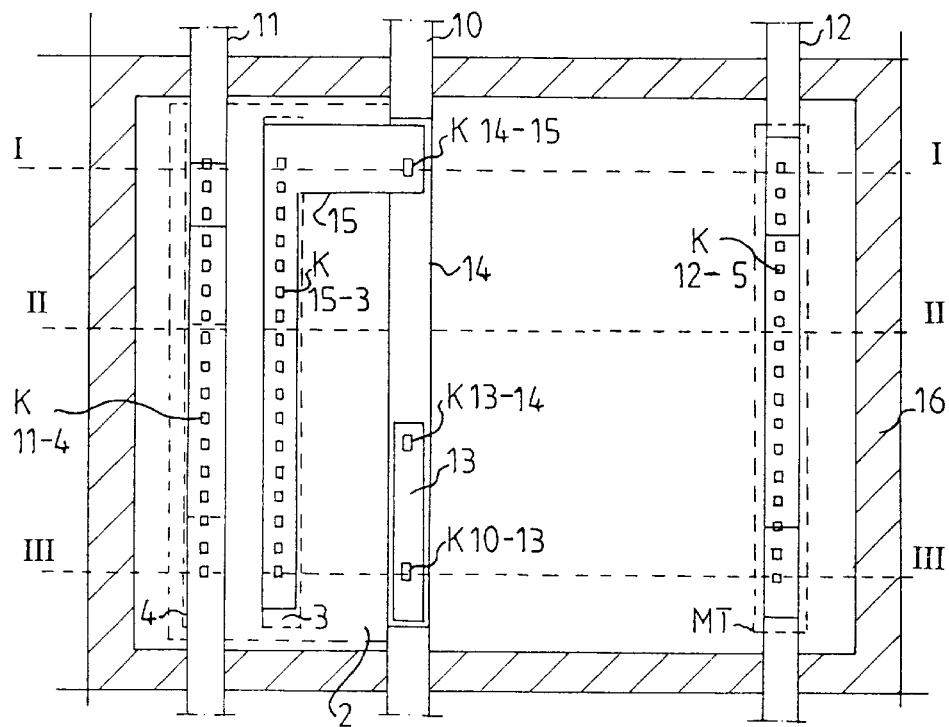
FIG. 2 shows a top view of the general overlay of a unit cell of a semiconductor device.
Figure 3:
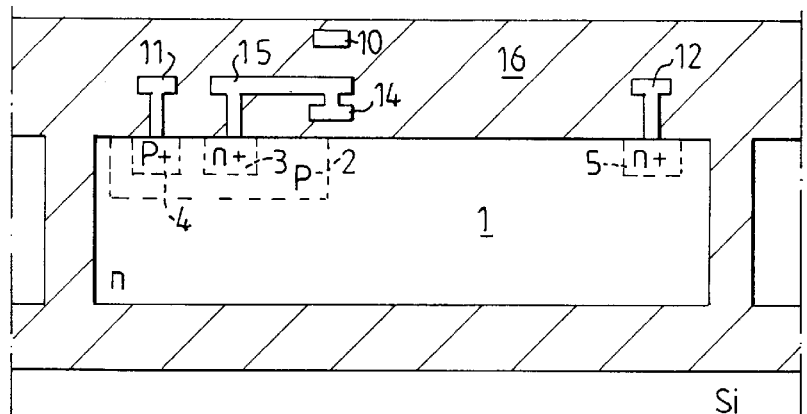
FIGS. 3–5 show cross sectional views of the unit cell in FIG. 2, in cross sections A—A, B—B and C—C respectively.
Figure 4:
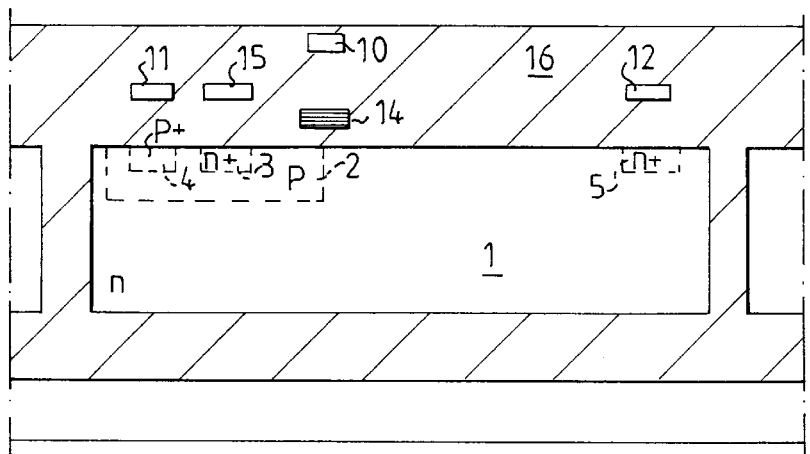
Figure 5:
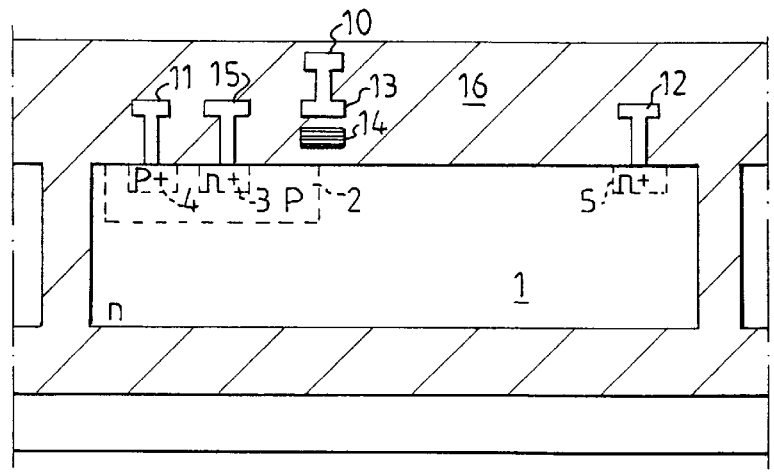

FIG. 2 shows a top view of an overlay structure of a further embodiment of the invention. Vertical cross sections taken at A—A, B—B and C—C of FIG. 2 are shown in FIGS. 3, 4 and 5 respectively. In this embodiment, each emitter finger as of FIG. 1 is part of a unit cell, which may form a complete transistor with the emitter, base and collector separately arranged in an isolated portion of the silicon chip. This is shown in all the Figures, where grossly hatched portions 16 denote either an isolating layer as e.g. silicon oxide material, as is normal in the SOI technology, or a layer having the opposite conduction type relative to the collector. In another, related embodiment, the same cell structure may be multiplied at will, the isolating portions 16 then being transferred to the exterior of the plurality of unit cells.

This cell thus has an immersed collector slab of n silicon 1, in which is diffused a base p zone 2. in which are in turn diffused an n+ emitter zone 3 and a p+ base connector zone. In the same surface is diffused an n+ collector contact zone 5. (Naturally all those features may have opposite conduction types for a pnp type bipolar transistor.)

The contacting of those zones is accomplished by connectors which are submersed in the top silicone oxide. Thus, the unit cells are joined by means of a set of connectors of metal, as the common emitter lead 10, the common base lead 1 land the common collector lead 12. As shown in FIG. 2 and in the cross section views in FIGS. 3 and 5, the collector contact zone 5 is connected to the metallic collector lead 12 by point contacts denoted K 12-5. (It is also possible to make one long continuous connection.) The metallic base lead 11 is connected in the same way to the base contact zone 4, by contacts denoted K 11-4.

As shown in the Figures, the collector contact zone 5 is arranged in the same surface as the emitter 3 and base 4 zones which is generally preferred in a SOI embodiment. There is, however, nothing to prevent, in a more general embodiment of the invention, to arrange the collector connection from the opposite side, or in a layer near the bottom oxide layer, as a buried layer collector, without departing from the invention. These and other modifications would be within the knowledge of one skilled in the art.

The connection between the common emitter lead 10 and the emitter zone 3 is, however, slightly more complicated, due to the ballast resistor 14. This resistive, elongate device, which is preferentially made from suitably doped polysilicon, but may be made of any suitable thin film resistor material, is laid on top of a thin $SiO_2$ layer and on top of the edge of base zone 2.

The metallic common emitter lead 10 is point-connected to one end of isolated second metal lead 13, parallel thereto and which may cover most of the cell length, but is here about one third thereof. This connection, seen in the section of FIG. 5, is denoted K10-13. At another point, visible in FIG. 2, a connection K13-14 is made between second metal lead 13 and ballast resistor layer 14. The ballast layer 14 is in turn connected at K14-15 (also shown in FIG. 5) to the short limb of L-shaped third metal lead 15, the long limb of which overlays emitter zone 3. The two latter are joined by numerous contact points K15-3 (also seen in FIGS. 3 and 5). It is clear that the position of contact K13-14 may be varied for obtaining different amounts of ballast resistance, in dependence of the intended use.

As understood by the man of the art, the cross-sectional views of FIGS. 3–5 have exaggerated thickness scales. The manufacture of such SOI material and SOI-material based components are also well-known. The manufacture of such material is described in Sorin Cristoveanu and Sheng S.Li: "Electrical Characterization of Silicon-On-Insulator Materials and Devices", 1995, Kluwer Academic Publishers, Massachusetts. USA. For further information on the various and many processing steps which can be used, reference is made to monograph literature in the field, as e.g. Wolf+Tauber, "Silicon Processing for the VLSI Era") (Lattice Press, Sunset Beach, Calif., 1986). Said publications are hereby included by reference into the present disclosure.

In the present Example, the buried insulator is made of silicon dioxide and the substrate of silicon. The thickness of the device layer may vary between 0.1 and 30 $\mu$m, but in a preferred embodiment, it is between 5 and 10 $\mu$m. The thickness of the buried layer can vary between 0.1 and 10 $\mu$m, but it is also possible to make the whole carrying substrate from insulator material. From such material is then made in successive steps the various layers as shown in FIGS. 3, 4 and 5, including the eventual separating isolation walls, added in ditches etched down to the buried insulation layer.

It is also understood by the man of the art that the unit cell as shown in FIGS. 2–5, and which can be used either singly or in multitude as in FIG. 1, is subject to many possible variations. The collector may be a buried collector, or the collector zone may be doubled (mirroring the overlay in FIG. 2 around conductor 11), etc.

Figure 6:
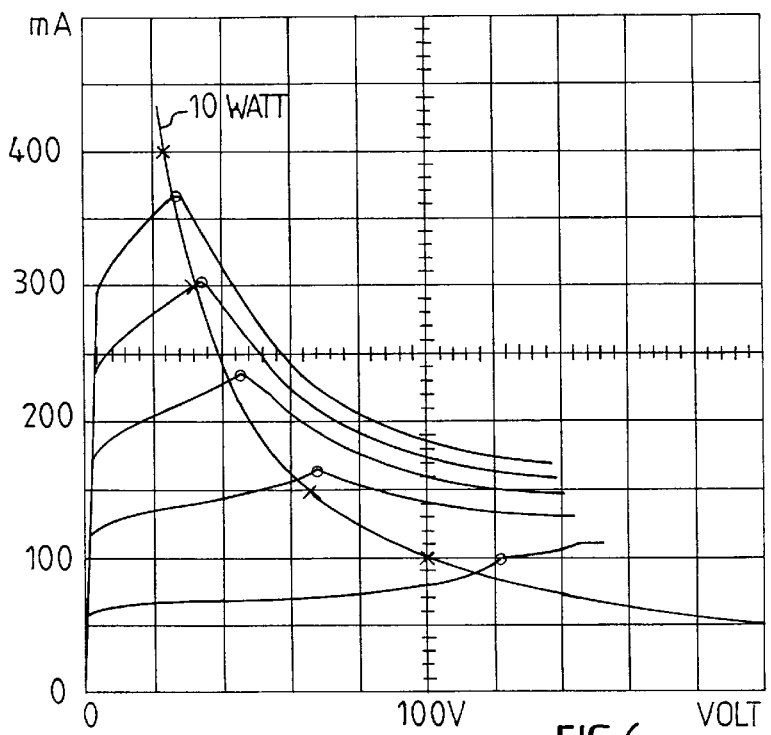
FIGS. 6 and 7 show comparative graphs for power handling with lumped and distributed ballast resistors respectively.
Figure 7:
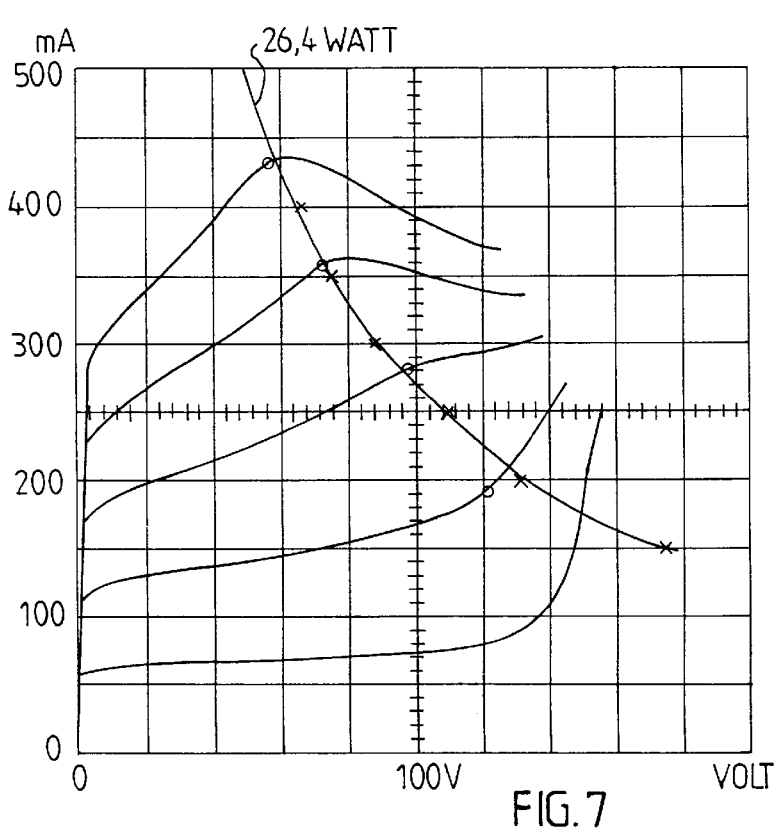

In FIGS. 6 and 7 are shown characteristic curves for a system with an array of 5×20 unit cells, built according to FIGS. 2–5, where in FIG. 6, external ballast resistors are applied to each column, using the old technique, whereas in FIG. 7, each cell is provided with a ballast resistor of about 140 $\Omega$. Thermal breakdown is obtained, as seen from the power curve of 10 W, at about that power, except for the high voltage end of the collector voltage, where avalanche breakdown occurs earlier. The same system but with ballast resistors is consistently better, consistent with some 25 W power, except for the high-voltage end.

Figure 8:
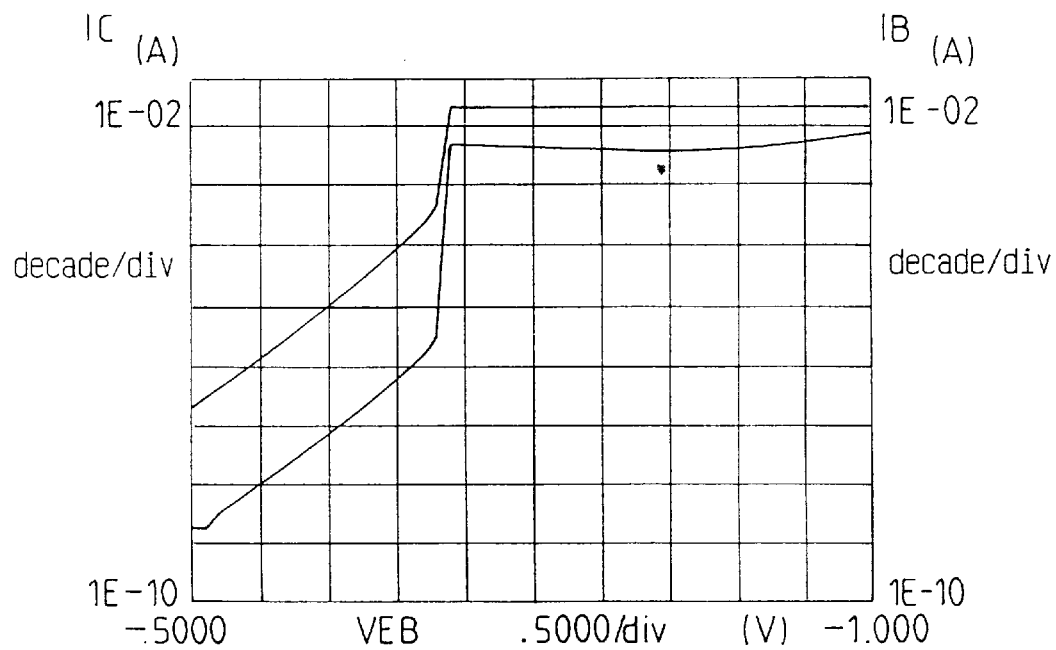
FIGS. 8 and 9 show graphs of base current and collector current in dependence of emitter-base voltage for semiconductors without and with distributed emitter ballast resistances.
Figure 9:
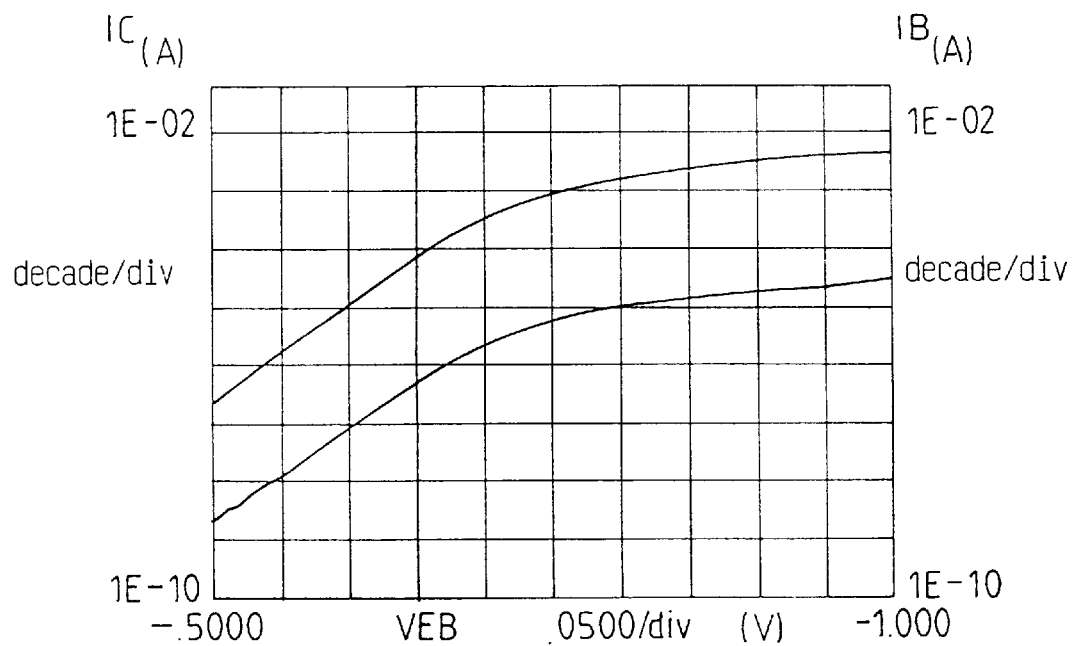

In FIG. 8 and FIG. 9 is shown a comparison made for one sole unit cell, having an emitter with the dimensions 100×2 $\mu$m. In both Figures are shown the base current and emitter current in logarithmic scale (one division per decade) as a function of the emitter-base voltage. The base-collector voltage was kept constant at +60 V. It can be seen that without the emitter ballast resistance, an emitter-base breakdown occurs at an emitter-base voltage of about −0.65 V and a collector current of about 0.5 mA. (The currents shown at higher emitter-base voltages are limited by the measuring apparatus.) With a ballast resistor of about 140 $\Omega$, as in FIG. 9, no runaway is apparent even at a collector current of some 5 mA.

The invention has been described essentially around a detailed embodiment, illustrated in the drawings. Some possible variations have been shortly mentioned, but it is apparent for the man of the art that the possibilities of variation are practically innumerable, and that the scope of the invention is limited only by the appended claims.

What is claimed is:

1. An integrated semiconductor device, comprising an elongate emitter, an elongate base, substantially parallel to the emitter, and a collector, the emitter being connected to an emitter lead via an elongate ballast resistor, the base being connected to a base lead and the collector being connected to a collector lead, wherein the elongate ballast resistor is substantially parallel to the elongate emitter and the elongate base, the elongate ballast resistor covering a surface portion of a collector region, the emitter lead having an electrical contact to a first point on the elongate ballast resistor, the emitter having an electric contact to a second point on said elongate ballast resistor and the resistance between said first point and said second point on the ballast resistor forming the ballast resistance for the emitter.

2. A semiconductor device according to claim 1, wherein the elongate ballast resistor has a length of 50–200 percent of the length of the elongate base.

3. A semiconductor device according to claim 1, wherein said emitter lead is parallel to said elongate ballast resistor, a second elongate lead and an end of a first limb of a lead isolatingly sandwiched in between, a second limb of said lead being laid contactingly over said emitter, said emitter lead being connected to said first point on the underlying elongate ballast resistor via a point contact to said second elongate lead, and said second point on the elongate ballast resistor being connected to said emitter via said lead.

4. A semiconductor device according to claim 1, said elongate ballast resistor is insulatingly covering a surface portion of a base-collector pn junction.

5. A semiconductor device according to claim 1, wherein the device is made in Silicon On Insulator technique.

6. A semiconductor device according to claim 1, wherein said elongate ballast resistors comprise silicon.

7. A semiconductor device according to claim 1, wherein the device is arranged in a portion of a chip, which is provided with isolation means for galvanic insulation from other chip portions containing other semiconductor devices.

8. An integrated semiconductor device, comprising an emitter, a base and a collector, said emitter being split into a plurality of emitter portions, each emitter portion connected to a common emitter lead via a separate, elongate ballast resistor, said emitter portions arranged elongately in a common direction, said ballast resistors substantially parallel to said common direction wherein said emitter lead has portions which are parallel to said common direction and adjacent each said elongate ballast resistor, and having an electrical contact to a first point on each said elongate ballast resistor, each said emitter portion having an electric contact to a second point on a said elongate ballast resistor, the resistance between a said first point and a said second point on a ballast resistor forming the ballast resistance for its connected emitter portion.

9. A semiconductor device according to claim 8, wherein a contact region of said collector and said base is also split into pluralities of collector and base portions respectively, connected to a common collector and base lead respectively, said pluralities of emitter, base and collector portions being distributed in cells, such that each cell is provided with a ballast resistor.

10. A semiconductor device according to claim 8, wherein the elongate ballast resistors have a length of 50–200 percent of the length of the said base portions.

11. A semiconductor device according to claim 8, wherein the device is made in Silicon On Insulator technique.

12. A semiconductor device according to claim 8, wherein said elongate ballast resistors are comprise silicon.

13. A semiconductor device according claim 8, wherein said elongate ballast resistor is insulatingly covering a surface portion of a base-collector pn junction.

14. A semiconductor device according to claim 8, wherein said common emitter lead in the cell is laid over said elongate ballast resistor, a second elongate lead and an end of a first limb of a lead isolatingly sandwiched in between, a second limb of said lead being laid contactingly over said emitter portion, said common emitter lead being connected to said first point on the underlying elongate ballast resistor via a point contact to said second elongate lead, and said second point on the elongate ballast resistor being connected to said emitter portion via said lead.

15. A semiconductor device according to claim 8, wherein the device is arranged in a portion of a chip, which is provided with isolation means for galvanic insulation from other chip portions containing other semiconductor devices.

* * * * *